United States Patent
Burlak et al.

(10) Patent No.: US 10,203,366 B2
(45) Date of Patent: Feb. 12, 2019

(54) TRANSDUCER RELIABILITY TESTING (71) Applicant: Mellanox Technologies, Ltd., Yokneam (IL)

(72) Inventors: Alex Burlak, Pardes Hana Karkur (IL); Lion Bassat, Pardes Hana Karkur (IL); Itshak Kalifa, Ramat Gan (IL); Kfir Margalit, Rehovot (IL); Morees Ghandour, Rama Village (IL); Alon Webman, Tel Aviv (IL); Elad Mentovich, Tel Aviv (IL); Sylvie Rockman, Zichron Yaakov (IL); Evelyn Landman, Haifa (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 181 days.

(21) Appl. No.: 15/199,105

(22) Filed: Jun. 30, 2016

(65) Prior Publication Data
US 2018/0003762 A1 Jan. 4, 2018

(51) Int. Cl.
*G01R 31/26* (2014.01)
*G01R 31/28* (2006.01)

(52) U.S. Cl.
CPC ..... *G01R 31/2635* (2013.01); *G01R 31/2874* (2013.01)

(58) Field of Classification Search
CPC ... G01R 31/26–31/275; G01R 31/2851; G01R 31/2853; G01R 31/2872; G01R 31/2874; H01S 5/00–5/0042; H01S 5/183–5/18397
See application file for complete search history.

(56) References Cited

U.S. PATENT DOCUMENTS

| 5,116,767 A | * | 5/1992 | DeChiaro | H01L 21/314 |
|---|---|---|---|---|
|  |  |  |  | 148/DIG. 95 |
| 7,440,865 B1 |  | 10/2008 | Hofmeister et al. |  |

(Continued)

FOREIGN PATENT DOCUMENTS

GB    2431304 A * 4/2007  ............... H02H 3/05

OTHER PUBLICATIONS

*Realiability of Various Size Oxide Aperture VCSELS*, Finisar (2007) 15 pages.

(Continued)

*Primary Examiner* — Tung X Nguyen
*Assistant Examiner* — David Frederiksen
(74) *Attorney, Agent, or Firm* — Alston & Bird LLP (57) ABSTRACT

A transducer reliability testing and VCSEL failure prediction method are provided. The method includes applying a testing temperature and a constant current to a VCSEL for a testing time. The method monitors a forward voltage of the VCSEL and determines if a first change in forward voltage is above a first predetermined threshold over the testing time and if a second change in forward voltage is above a second predetermined threshold over a portion of the testing time. The method determines failure of the VCSEL if either of these predetermined thresholds are exceeded. The method determines passage of the VCSEL if the first change in the forward voltage and the second change in the forward voltage are both below the first predetermined threshold and the second predetermined threshold, respectively.

20 Claims, 4 Drawing Sheets (56) References Cited

U.S. PATENT DOCUMENTS

| | | | | |
|---|---|---|---|---|
| 2008/0129983 A1* | 6/2008 | Mathes | ............. | G01M 11/3145 356/73.1 |
| 2010/0273278 A1* | 10/2010 | Omori | ................ | G01R 31/2635 438/16 |
| 2012/0242990 A1* | 9/2012 | Nakata | ................. | H01S 5/0021 356/402 |
| 2017/0141537 A1* | 5/2017 | Onaka | ................ | H01S 5/06825 |

OTHER PUBLICATIONS

Meyer, P., *Pulse Testing of Laser Diodes*, Keithley Instruments, Inc (May 29, 2008) 11 pages.

\* cited by examiner

TRANSDUCER RELIABILITY TESTING

FIELD OF THE INVENTION

The present disclosure relates generally to vertical-cavity surface-emitting lasers (VCSELs) and, more particularly, to apparatuses and associated methods of predicting the failure of VCSELs.

BACKGROUND OF THE INVENTION

Optical communication systems include cables that transmit signals over optical media. Optical communication systems may include separate circuitry that facilitates the transmissions along the optical cables using one or more transducers. For example, modern optical communications systems may use vertical-cavity surface-emitting lasers (VCSELs) as optoelectronic transducers that convert electrical signals to light for transmission through the fiber optic cables.

One of the primary modes of failure in optical communication systems is the random failure of the optoelectronic transducers. Traditionally, failure in these transducers (e.g., the VCSELs) requires the entire optoelectronic transducer to be replaced, which incurs substantial cost in terms of down time, labor, and other costs to the user.

Applicant has identified a number of additional deficiencies and problems associated with conventional VCSELs and associated testing methods. Through applied effort, ingenuity, and innovation, many of these identified problems have been solved by developing solutions that are included in embodiments of the present invention, many examples of which are described in detail herein.

BRIEF SUMMARY OF THE INVENTION

Accordingly, the methods described herein provide improved mechanisms for detecting potential failures in optoelectronic components, such as VCSELs, during a testing phase (prior to installation and operation of the component in an optical communication system), and further provide improved mechanisms for monitoring optoelectronic components (e.g., VCSELs) during operation and compensating for changes in the operational characteristics of the components over time by adjusting relevant operating parameters to maintain desired results.

In some embodiments, a method for testing a vertical cavity surface emitting laser (VCSEL) for emitting light is provided, where the method comprises applying a testing temperature to a VCSEL for a testing time; applying a constant current to the VCSEL for the testing time; and monitoring a forward voltage for the VCSEL. If a first change in the forward voltage is above a first predetermined threshold over the testing time, failure of the VCSEL is determined. In addition, if a second change in the forward voltage is above a second predetermined threshold over a portion of the testing time, failure of the VCSEL is determined. Thus, if the first change in the forward voltage over the testing time is below the first predetermined threshold and if the second change in the forward voltage over the portion of the testing time is below the second predetermined threshold, passage of the VCSEL is determined.

In some cases, the testing temperature may be about 150° C., and the testing time may be about 464 hours. In such cases, the first predetermined threshold may be 10 mV, and the second predetermined threshold may be 20 mV. The portion of the testing time may, in some cases, be a final 336 hours of the testing time. Moreover, the change in forward voltage may be determined at 8 hours, 128 hours, and 464 hours of the testing time.

In other cases, the testing temperature may be about 25° C.

The VCSEL may, in some embodiments, be subjected to a burn-in period, wherein the burn-in period is a 4-hour time period prior to the testing time in which the VCSEL is subjected to a temperature of about 150° C.

In still other cases, upon determining failure of the VCSEL, one or more operating parameters of the VCSEL may be adjusted. Furthermore, the forward voltage for the VCSEL may be measured at a driver of the VCSEL.

In other embodiments, a non-transitory computer-readable medium is provided having computer program instructions stored thereon, the computer program instructions being configured to monitor an operating temperature of a VCSEL; monitor an operating current of the VCSEL; and monitor a forward voltage for the VCSEL. The computer program instructions may further be configured to determine failure of the VCSEL, if a change in the forward voltage is above a predetermined threshold over a period of time; to determine passage of the VCSEL if the change in the forward voltage over the period of time is below the predetermined threshold, and to adjust an operating parameter of the VCSEL in an instance in which failure of the VCSEL is determined.

In some cases, the computer program instructions may be embodied by firmware installed on a micro-controller or a driver. The operating temperature may be about 25° C. The predetermined threshold may, in some cases, be 20 mV, while in other cases the predetermined threshold may be 10 mV.

Additionally, the VCSEL may, in some cases, be subjected to a burn-in period, wherein the burn-in period is a 4-hour time period prior to installation in which the VCSEL is subjected to a temperature of about 150° C. Moreover, the operating parameter that is adjusted may comprise the operating temperature of the VCSEL, while in other cases the operating parameter that is adjusted may comprise the operating current of the VCSEL.

In some embodiments, the computer program instructions may be further configured to generate an alarm condition in an instance in which failure of the VCSEL is determined.

BRIEF DESCRIPTION OF THE SEVERAL VIEWS OF THE DRAWINGS

Having thus described the invention in general terms, reference will now be made to the accompanying drawings, which are not necessarily drawn to scale, and wherein:

DETAILED DESCRIPTION

Overview

Optical cables are comprised of optical fibers. Optical cables may be utilized in conjunction with optical transmitters and receivers built into transceiver modules and systems located at the ends of the optical cables for transmitting and receiving the optical communication signals carried by the fibers. The transceiver modules may include small form-factor pluggable (SFP) transceivers or dual SFP transceivers. The transceiver modules or systems may plug into suitable electrical communication ports, such as Gigabit Ethernet or InfiniBand® ports, of switching and computing equipment. Optoelectronic components in the transceiver modules and systems may convert the high-speed electrical signals output by the ports into optical signals for transmission over the fibers. In addition, the optoelectronic components may convert the optical signals received over the fibers into high-speed electrical signals for input to the electrical communication ports.

In many transceiver modules and systems, laser diodes, such as VCSELs, are used to generate optical signals for transmission over optical fibers. VCSELs in particular are favored for their high bandwidth and efficiency. In some implementations, an array of such VCSELs is used to drive a corresponding array of optical fibers, which are joined together in a ribbon configuration. Optical fibers may be connected to both VCSELs and photodiode configurations on opposing ends such that one or more photodiodes may receive the light from the VCSELs at a receiving end of the fibers and convert the incident light into electrical signals. One or more sources may provide the electrical signals for transmission from a transmitting device or may receive the electrical signals after receipt from the transmitting device, and the sources may provide the electrical signals to the VCSELs for transmission as optical signals via optical fibers or may receive the electrical signals from the photodiodes via optical fibers.

In manufacturing transceiver modules and systems, laser diodes, such as VCSELs, are often subjected to a high-temperature operating life (HTOL) testing procedure. An HTOL test is a test for determining the reliability of the components found in the transceiver modules and systems, and may be conducted prior to installation of the component in an operational system. Conventional HTOL tests subject a VCSEL to an elevated temperature for a period of time and determine the expected reliability of the VCSEL once it is installed in an optical communication system in a datacenter based upon the observed results. Often, the VCSEL may be subjected to a burn-in period before the HTOL test is conducted to ensure that the VCSEL has achieved uniform characteristics in order to improve testing results. Conventional HTOL testing procedures, however, may fail to accurately identify VCSELs that have a high likelihood of failure or are prone to certain modes of failure (e.g., random failures). For example, the tolerances used in conventional HTOL testing procedures are often broad, such that VCSELs exhibiting characteristics associated with the random failure of the VCSEL are deemed to pass the testing and are provided to users for installation, resulting in their eventual premature failure in operation.

Embodiments of the present invention that are described hereinbelow provide an improved method for testing the reliability and accurately predicting the failure of a VCSEL prior to installation of the VCSEL in an operational optical communication system. In addition, embodiments of the present invention also provide for continual monitoring of the VCSEL during operation, once installed in the system, to detect and/or compensate for changes in the operational characteristics leading up to failure of the component.

As described in greater detail below, the method may be implemented by a programmable optoelectronic interface that subjects the VCSEL to a temperature for a period of time (e.g., a testing time) in order to test the reliability of the VCSEL. The interface may subject the VCSEL to a constant current during the testing time in order to monitor the forward voltage change experienced by the VCSEL. The forward voltage is the voltage drop across the VCSEL, such as the difference between the voltage at an anode of the VCSEL and the voltage at a cathode of the VCSEL, as would be understood by one or ordinary skill in the art in light of this disclosure. The change in forward voltage may be determined at various intervals during the testing time. The method may compare the change in forward voltage experienced by the VCSEL with various predetermined thresholds at different time periods, as described below. The method may predict the failure of the VCSEL if any of the predetermined threshold values are exceeded. Thus, through applied effort, ingenuity, and innovation, the inventors have found that a change in forward voltage experienced by the VCSEL can be correlated to defects that influence the VCSEL performance. If the predetermined threshold values are not exceeded during the testing time, the method may quantify the reliability of the VCSEL.

In some embodiments, a method may be executed while the VCSEL is in operation to predict and/or prevent or compensate for the failure of the VCSEL. In some embodiments, the method may, upon determining that the change in forward voltage has exceeded a threshold value, present a warning to the user such that the user may prepare for the failure of the VCSEL. The method may be implemented by a programmable optoelectronic interface comprised of a controller (e.g., a microcontroller) and a driver, as described below. In such an embodiment, the controller and the driver may be configured to provide the warning to the user. Additionally, the controller and the driver, upon determining that the change in forward voltage has exceeded a threshold value, may be configured to adjust an operating parameter of the VCSEL to increase the amount of time the VCSEL is operational before failure and/or compensate for changes in the operating characteristics of the VCSEL.

In some embodiments, the method may be enacted via an optical transceiver system comprised of a VCSEL, a driver, and/or a micro-controller. The driver and/or micro-controller may operate to ensure that the testing/monitored conditions (e.g., the temperature, current, etc.) are constant and accurate throughout the process. The driver and/or micro-controller may also operate to monitor the forward voltage experienced by the VCSEL and determined a value for this forward voltage over a period of time. The driver and/or micro-controller may compare this determined forward voltage value with one or more predetermined threshold values and predict/compensate for the likelihood of failure of the VCSEL, as described below in greater detail.

For the sake of clarity and convenience of description, the embodiments that are described below refer to a particular optical cable configuration, using VCSELs as emitters and certain types of switching elements. The principles of the present invention, however, may similarly be implemented using other types of emitters (e.g., other types of lasers), modulators, and switching elements, as well as other optoelectronic transceiver components (e.g., photodiodes and differently configured optical cables and connector modules).

VCSEL Testing

Figure 1A:
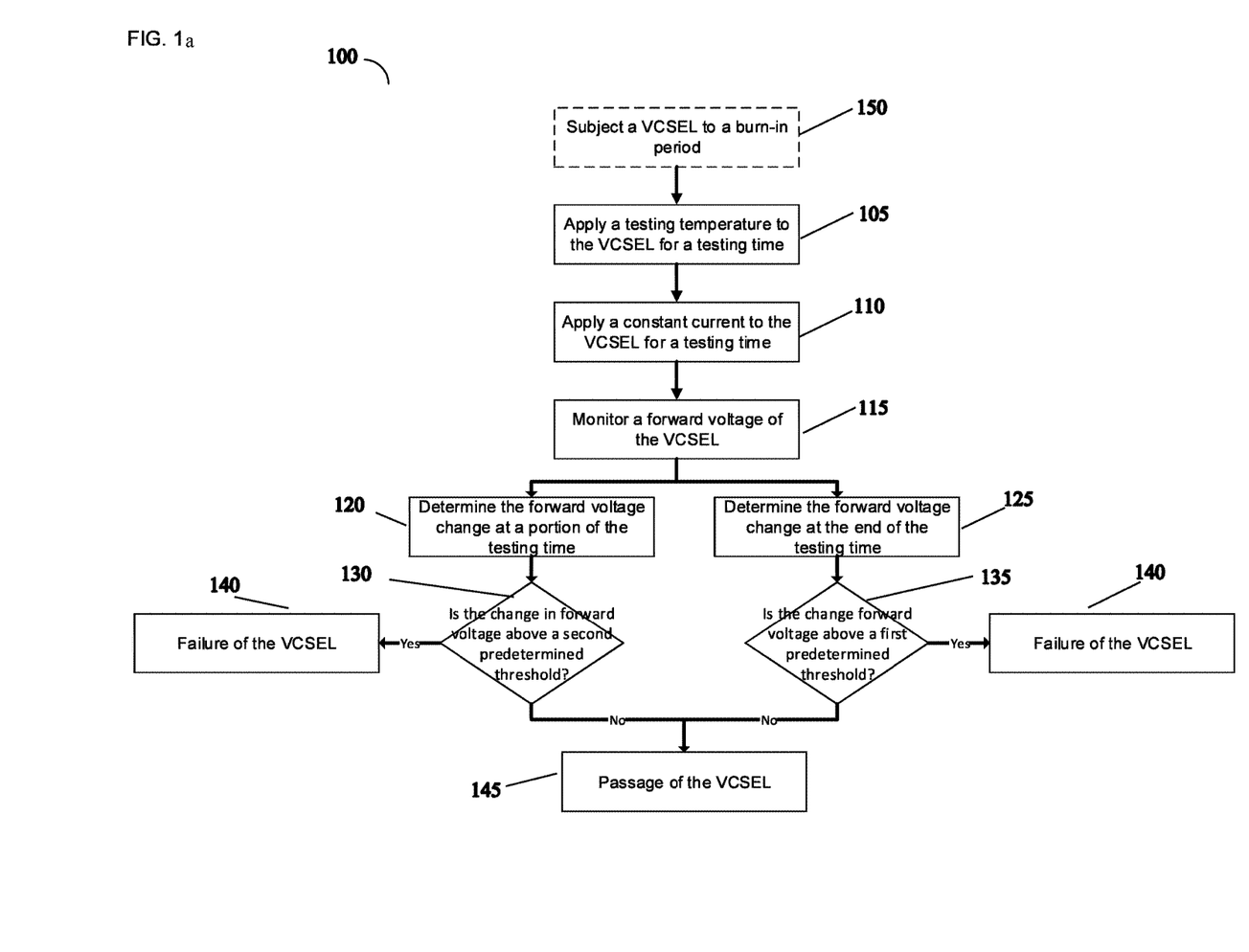
FIG. 1a shows a block diagram illustrating testing procedures, in accordance with some embodiments discussed herein.

With reference to FIG. 1a, a block diagram is provided that illustrates a VCSEL failure prediction method 100 for use with some embodiments described herein. The method may include the steps of applying a testing temperature at Block 105 and a constant current at Block 110 to a VCSEL for a testing time (e.g., a period of time over which the test is conducted), such as prior to installation of the VCSEL in an optical communication system. The method may also include monitoring the forward voltage of the VCSEL at Block 115 and determining the forward voltage change at the end of the testing time at Block 125 and/or after a portion of the testing time at Block 120 has passed. The method may utilize predetermined thresholds (e.g., at Blocks 130, 135) to predict the failure of the VCSEL at Block 140 or the passage of the VCSEL at Block 145.

With continued reference to FIG. 1a, a VCSEL failure prediction method 100 may apply a testing temperature to the VCSEL for a testing time at Block 105. In some embodiments, the VCSEL may be tested at a nominal temperature of 150° C. In some embodiments, the VCSEL may be tested at a nominal temperature of 25° C. The use of two or more temperatures during testing may, in some cases, provide more accurate results. For example, an elevated testing temperature (e.g., a nominal temperature of 150° C.) may be used in some cases to accelerate the different failure mechanisms applicable to the component being tested (e.g., the VCSEL). Moreover, other temperatures may be used to test the reliability of other types of components. The testing temperatures may, for example, be determined empirically and may change depending on the component being tested. In some embodiments, the testing temperature may be selected using the Arrhenius equation (for reliability), an equation used to calculate thermal acceleration factors for semiconductor device time-to-failure distributions.

Figure 2:
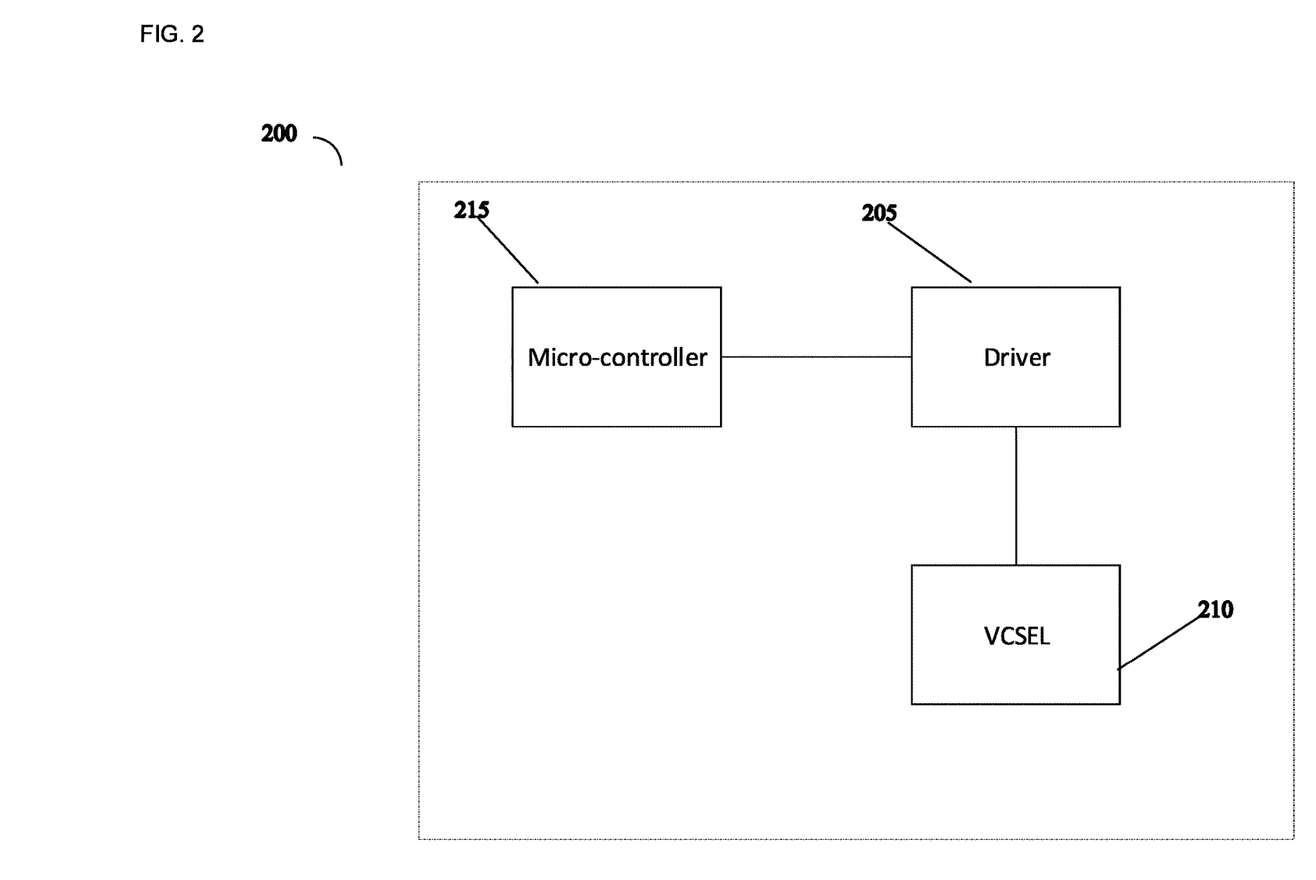
FIG. 2 shows a block diagram schematically illustrating an optical transceiver system, in accordance with some embodiments discussed herein.

The VCSEL failure prediction method 100 may be employed by a testing system, such as at the manufacturer site, to determine whether the VCSEL can be installed in a transceiver system (e.g., an optical transceiver system 200 shown in FIG. 2). In some embodiments, for example, the testing time may be a nominal period of 464 hours.

In addition to an elevated temperature, the VCSEL failure prediction method 100 may also apply a constant current to the VSCEL at Block 110, such that the forward voltage of the VCSEL may be monitored at Block 115. In particular, Ohms law states that $V = I \cdot R$, where V is voltage, I is current, and R is resistance, which is a characteristic of the VCSEL. By utilizing a VCSEL with a particular resistance value and applying a constant current at Block 110, a monitored change in the voltage of the VCSEL may be indicative of a change in the characteristics of the VCSEL, namely, a change in the VCSEL's resistance. This change in voltage may thus be indicative of the likelihood of failure of the VCSEL, as a change in the VCSEL's operating characteristics may indicate or predict a change in the operation of the VCSEL, which in many cases may be regarded as a failure of the component.

The VCSEL failure prediction method 100 may utilize a first predetermined threshold and a second predetermined threshold with respect to a forward voltage change determined at the end of the testing time and/or over a portion of the testing time, respectively, as shown in Blocks 120, 125. In some embodiments, for example, the VCSEL failure method 100 may determine the forward voltage change over a portion of the testing time at Block 120, where the portion of the testing time is the final 336 hours of the testing time. For example, if the testing time (e.g., the duration of the test) is 400 hours, the portion of the testing time that may be monitored in this case may be from Hour 64 to Hour 400 (e.g., the final 336 hours of the test). In such an embodiment, the method may, for example, determine if the change in the forward voltage exceeds a second predetermined threshold value of 10 mV at any time during that portion (e.g., the final 336 hours of the testing time). If the method determines that the change in forward voltage over the portion of the testing time exceeds the second predetermined threshold at Block 130, the method may determine that the VCSEL has a high likelihood of failure at Block 140.

Additionally or alternatively, in some embodiments, the VCSEL failure prediction method 100 may determine the forward voltage change over the entire testing time at Block 125, and in some cases the entire testing time may be a nominal period of 464 hours. In such an embodiment, the method may, for example, determine if the change in the forward voltage exceeds a first predetermined threshold value of 20 mV. If the method determines that the change in forward voltage over the entirety of the testing time at Block 125 exceeds the first predetermined threshold at Block 135, the method may determine that the VCSEL has a high likelihood of failure at Block 140.

In some embodiments, the VCSEL failure prediction method 100 may determine the passage of the VCSEL at Block 145 if the change in the forward voltage is determined over a portion of the testing time at Block 120 is below the second predetermined threshold and also if the change in the forward voltage is determined at the end of the testing time at Block 125 is below the first predetermined threshold at Blocks 130, 135, respectively. In such an embodiment, the VCSEL failure prediction method 100 may quantify the reliability of the VCSEL.

Although the VCSEL failure prediction method 100 in FIG. 1a is described as determining the forward voltage of the VCSEL at the end of the testing time 125 and over a portion of the testing time 120, the present disclosure contemplates that the forward voltage change of the VCSEL may be determined at any point throughout the testing time. By way of example, the VCSEL failure prediction method 100 may determine the change in forward voltage at the $8^{th}$ hour, at the $128^{th}$ hour, at the $464^{th}$ hour, etc.

In some embodiments, the VCSEL failure prediction method 100 may employ a burn-in period at Block 150 prior to applying the testing temperature to the VCSEL for a testing time at Block 105. Burn-in periods may be utilized in transceiver systems and other optical communication systems, for example, as a means for normalizing the transceiver components prior to testing. During a burn-in period at Block 150, the VCSEL may be subjected to an elevated temperature for a period of time to eliminate the likelihood of potential spikes in forward voltage change to ensure accurate results during the testing of the VCSEL failure prediction method 100. For example, in some embodiments, the burn-in period may be a 4-hour time period in which the VCSEL is subjected to a nominal temperature of 150° C.

Figure 1B:
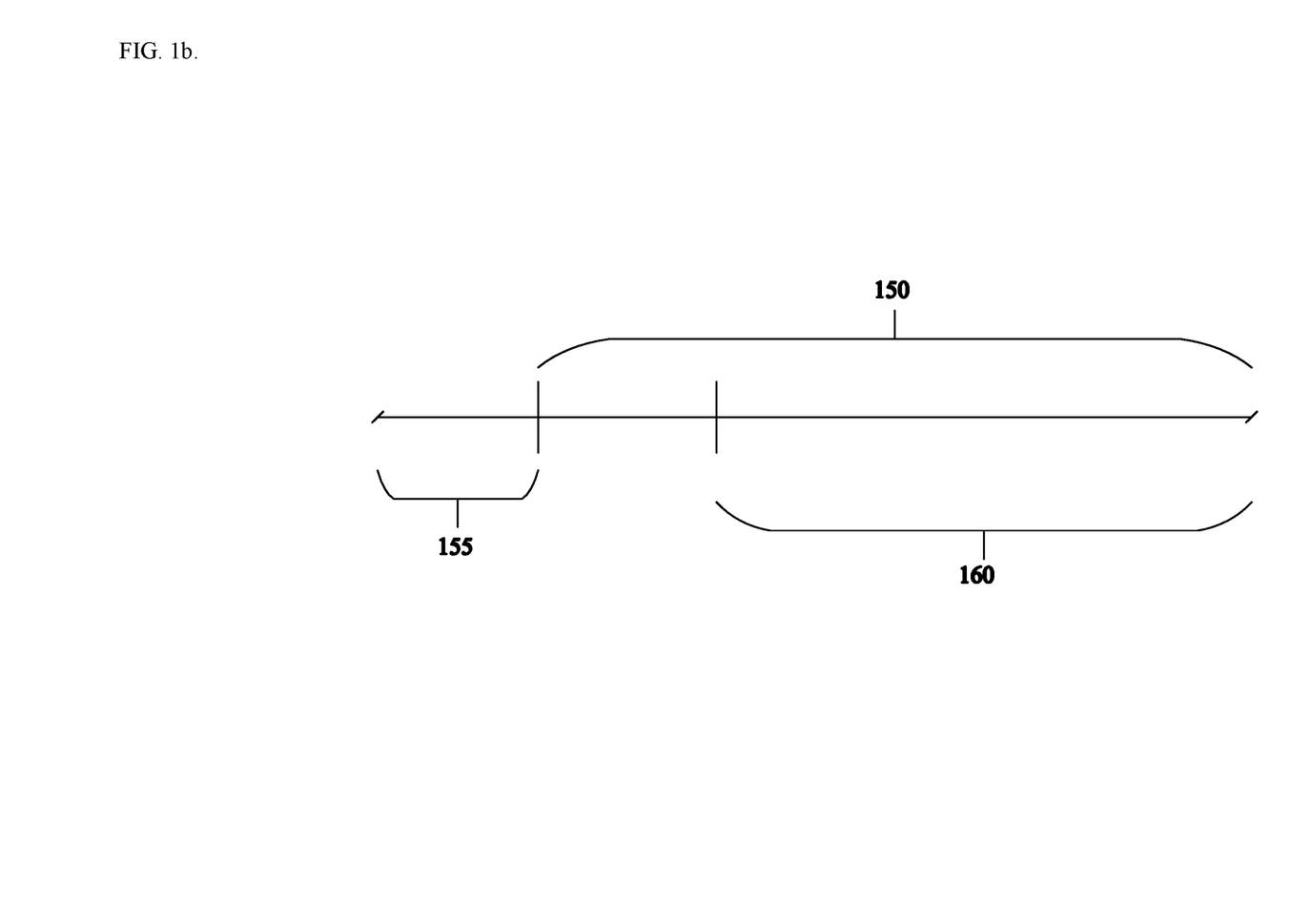
FIG. 1b shows a diagram illustrating the testing time, in accordance with some embodiments discussed herein.

With reference to FIG. 1b, for example, an example timeline is illustrated that shows a burn-in period 155, a testing time 150, and a portion of the testing time 160. As described in detail above, in some embodiments, the method may, for example, employ a burn-in period 155 of 4 hours, a testing time 150 of 464 hours, and a portion of the testing time 160 being the final 336 hours of the testing time 150.

The present disclosure contemplates that it may be advantageous to the user for the operating parameters of the VCSEL to be monitored during operation of the VCSEL as part of an optical communication system (e.g., in the installed configuration) by determining a change in the forward voltage of the VCSEL. In such an embodiment, a method may, for example, monitor an operating temperature and an operating current (e.g., inputted electrical signal) of the VCSEL. In this way, the forward voltage may be determined by the method, and a change in the determined forward voltage may be compared with one or more predetermined threshold values to predict the likelihood of failure of the VCSEL, as described herein in greater detail. Upon predicting the likelihood of failure of the VCSEL, the method may provide a warning to the user and/or may adjust one or more operating parameters of the VCSEL to increase the amount of time the VCSEL is operational before failure and/or compensate for changes in the operating characteristics of the VCSEL.

Figure 3:
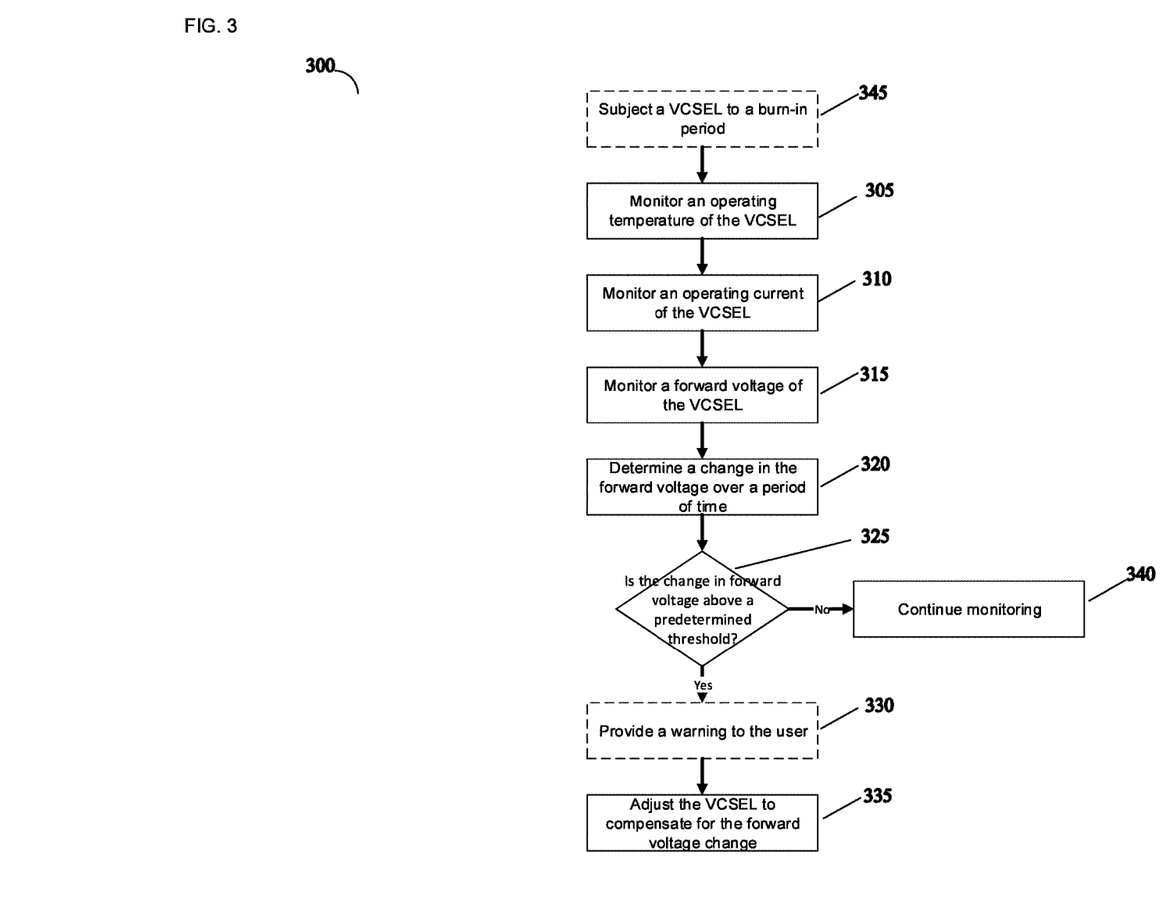
FIG. 3 shows a block diagram illustrating monitoring procedures having a warning or adjustment feature, in accordance with some embodiments discussed herein.

With reference to FIG. 3, for example, a block diagram is provided that illustrates a VCSEL failure prediction method 300 for use with some embodiments described herein. The method may include the steps of monitoring an operating temperature at Block 305 and monitoring an operating current at Block 310 of a VCSEL during operation (e.g., with the VCSEL installed in the optical communication system). The method may also include monitoring the forward voltage of the VCSEL at Block 315 and determining a forward voltage change over a period of time during operation of the VCSEL at Block 320. The method may utilize a predetermined threshold to predict the failure of the VCSEL by determining whether the change in the forward voltage (over the time of operation) is above the predetermined threshold at Block 325 and may further provide a warning to the user at Block 330 in the event the change in forward voltage is not in conformance. In some cases, the method may, upon determining that the forward voltage change exceeds the predetermined threshold at Block 325, adjust the operation of the VCSEL to compensate for the forward voltage change at Block 335, such as by providing higher or lower current as the electrical input signal to the VCSEL and/or adjusting an operating temperature of the VCSEL. Accordingly, in such embodiments, the method may be conducted continuously during operation of the VCSEL, with alerts provided to the user. In still other cases, the forward voltage change data may be stored and/or analyzed to determine trends, even when the forward voltage change is below the predetermined threshold (e.g., in conformance).

With continued reference to FIG. 3, a VCSEL failure prediction method 300 may monitor an operating temperature of the VCSEL at Block 305. In some cases, for example, the operating temperature may be a nominal temperature of 25° C. The VCSEL failure prediction method 300 may also monitor an operating current of the VSCEL at Block 310 such that the forward voltage of the VCSEL may be monitored at Block 315.

The VCSEL failure prediction method 300 may refer to a predetermined threshold 325 and may use the predetermined threshold to determine whether the monitored forward voltage is acceptable over a period of time that the VCSEL is in operation at Block 320. If the method determines that the change in forward voltage over that period of time exceeds a predetermined threshold at Block 325, the method may provide a warning to the user at Block 330. In some embodiments, if the predetermined threshold value is not exceeded at Block 325, the method may continue operating the VCSEL as before (e.g., without changes to the operational parameters) and may continue monitoring the VCSEL at Block 340, such as by continuing to monitor an operating temperature, an operating current, and a forward voltage with respect to the predetermined threshold.

In some embodiments, the VCSEL failure prediction method 300 may, upon determining that the predetermined threshold 325 has been exceeded, adjust the operating parameters of the VCSEL 210 so as to compensate for the change in forward voltage at Block 355. For example, the inputted electrical signal to the VCSEL 210 may be adjusted up or down to produce a desired optical signal (e.g., an optical signal that is at the desired wavelength or an acceptable range of wavelengths) from the VCSEL under the modified operating conditions detected by the method. In such an embodiment, this compensation for the change in forward voltage 355 may serve to prolong the amount of time the VCSEL is operational (e.g., producing the desired optical signals) before failure.

Although the VCSEL failure prediction method 300 in FIG. 3 is described as determining the forward voltage of the VCSEL over a period of time at Block 320, the present disclosure contemplates that the forward voltage change of the VCSEL may be determined at any point throughout the period of time that it is being monitored. By way of example, the VCSEL failure prediction method 300 may determine the change in forward voltage at the $8^{th}$ hour, at the $128^{th}$ hour, and/or at the $464^{th}$ hour of the operation time, or at regular intervals thereof. As described above, in some embodiments, the VCSEL failure prediction method 300 may employ a burn-in period at Block 345 prior to installing and operating the VCSEL 210.

The present disclosure contemplates that the VCSEL failure prediction method 300 may be implemented in an optical transceiver system (e.g., the optical transceiver system 200 in FIG. 2) via a driver and/or micro-controller (e.g., the driver 205 and the microcontroller 215 in FIG. 2) during operation (e.g., after the optical transceiver system 200 has been installed in an optical communication system in a datacenter and is in operation). In such an embodiment, the driver and/or micro-controller may continuously or continually monitor the forward voltage change of the VCSEL during operation and may continuously/continually compare the determined forward voltage to the predetermined threshold, according to embodiments of the method 300 described above. In such an embodiment, the VCSEL failure prediction method 300 may provide a warning to the user at Block 330, such that the user may prepare for the failure of the VCSEL and respond accordingly. Additionally, as described above, in some embodiments the method 300 may provide for the automatic adjustment of the operating parameters of the VCSEL at Block 335, such as by communicating with the driver 205 and/or the micro-controller 215, and adjusting the operating parameters of the VCSEL (e.g., the operating temperature and/or current) to compensate for the changes in the output of the VCSEL that would otherwise be caused by the changes in the VCSEL's operating characteristics, thereby prolonging the amount of time the VCSEL is operational.

With reference to FIG. 2, for example, a block diagram is provided that shows schematically an optical transceiver system 200 capable of employing embodiments of the VCSEL failure prediction method 100 and/or the (installed) failure prediction method 300 shown in FIGS. 1 and 3, respectively. An optical transceiver system 200 may include a driver 205, a VCSEL 210, and/or a micro-controller 215. In some cases, the method 300 may be implemented via firmware installed in the driver 205 and/or the micro-controller 215. For example, the driver 205 and/or the micro-controller 215 may include non-transitory computer-readable medium having computer instructions stored thereon. The driver 205 may be configured to provide an electrical input (e.g., a current) to the VCSEL 210 to produce an optical signal output from the VCSEL at a desired wavelength. The driver 205 may be embodied as hardware, software, and/or firmware, which may, in some cases, include the functionality of the micro-controller 215. In other cases, however, a separate micro-controller 215 may be provided that is in communication with the driver 205 and directs the operation of the driver, as shown in FIG. 2.

In some cases, the micro-controller 215 may be configured to direct the driver 205 to apply a current to the VCSEL 210, such that the forward voltage drop experienced by the VCSEL 210 may be measured at the driver 205 by the micro-controller 215. The micro-controller 215 may be configured, with regard to the pre-installation method 100, to ensure that the testing conditions (e.g., the testing temperature and the constant current values) remain constant for the duration of the testing time. The micro-controller may also be configured, with regard to method 300, to monitor the operating parameters (e.g., the operating temperature and the operating current) of the optical transceiver system 200 to ensure accurate determinations of the forward voltage drop experienced by the VCSEL 210, as measured at the driver 205.

Accordingly, as described above, FIGS. 1 and 3 illustrate flowcharts of systems, methods, and computer program products according to example embodiments of the invention. It will be understood that each block of the flowcharts, and combinations of blocks in the flowcharts, may be implemented by various means, such as hardware, firmware, processor, circuitry, and/or other devices associated with execution of software including one or more computer program instructions, as described above. For example, one or more of the procedures described above may be embodied by computer program instructions. In this regard, the computer program instructions which embody the procedures described above may be stored by a memory employing an example embodiment of the present invention and executed by a processor (e.g., the micro-controller or driver with controller circuitry, or a computer implementing testing prior to installation of the VCSEL or other component in an optical communication system). As will be appreciated, any such computer program instructions may be loaded onto a computer or other programmable apparatus (e.g., hardware) to produce a machine, such that the resulting computer or other programmable apparatus implements the functions specified in the flowchart block(s). These computer program instructions may also be stored in a computer-readable memory that may direct a computer or other programmable apparatus to function in a particular manner, such that the instructions which execute on the computer or other programmable apparatus provide operations for implementing the functions specified in the flowchart block(s).

Many modifications and other embodiments of the inventions set forth herein will come to mind to one skilled in the art to which these inventions pertain having the benefit of the teachings presented in the foregoing descriptions and the associated drawings. Although the figures only show certain components of the methods and systems described herein, it is understood that various other components may also be part of the optoelectronic coupler and transceiver modules. In addition, the methods described above may include fewer steps in some cases, while in other cases may include additional steps. Modifications to the steps of the testing and monitoring methods described above, in some cases, may be performed in any order and in any combination.

Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method for testing a vertical cavity surface emitting laser (VCSEL) for emitting light, comprising:
   applying, via a driver, a testing temperature to a VCSEL for a testing time;
   applying, via the driver, a constant current to the VCSEL for the testing time;
   monitoring, via a controller, a forward voltage for the VCSEL;
   determining, via the controller, if a first change in the forward voltage is above a first predetermined threshold over the testing time, failure of the VCSEL;
   determining, via the controller, if a second change in the forward voltage is above a second predetermined threshold over a portion of the testing time, failure of the VCSEL; and
   determining, via the controller, if the first change in the forward voltage over the testing time is below the first predetermined threshold and if the second change in the forward voltage over the portion of the testing time is below the second predetermined threshold, passage of the VCSEL.

2. The method according to claim 1, wherein the testing temperature is about 150° C.

3. The method according to claim 2, wherein the testing time is about 464 hours.

4. The method according to claim 3, wherein the first predetermined threshold is 10 mV.

5. The method according to claim 3, wherein the second predetermined threshold is 20 mV.

6. The method according to claim 3, wherein the portion of the testing time is a final 336 hours of the testing time.

7. The method according to claim 3, wherein the change in forward voltage is determined at 8 hours, 128 hours, and 464 hours of the testing time.

8. The method according to claim 1, wherein the testing temperature is about 25° C.

9. The method according to claim 1, further comprising subjecting the VCSEL to a burn-in period, wherein the burn-in period is a 4-hour time period prior to the testing time in which the VCSEL is subjected to a temperature of about 150° C.

10. The method according to claim 1, wherein upon determining failure of the VCSEL, one or more operating parameters of the VCSEL are adjusted.

11. The method according to claim 1, wherein the forward voltage for the VCSEL is measured at a driver of the VCSEL.

12. A non-transitory computer-readable medium having computer program instructions stored thereon, the computer program instructions being configured to:
   monitor an operating temperature of a vertical cavity surface emitting laser (VCSEL);
   monitor an operating current of the VCSEL;
   monitor a forward voltage for the VCSEL;
   determine, if a change in the forward voltage is above a predetermined threshold over a period of time, failure of the VCSEL;
   determine, if the change in the forward voltage over the period of time is below the predetermined threshold, passage of the VCSEL; and adjust, in an instance in which failure of the VCSEL is determined, an operating parameter of the VCSEL.

13. The computer-readable medium according to claim 12, wherein the computer program instructions are embodied by firmware installed on a micro-controller or a driver.

14. The computer-readable medium according to claim 12, wherein the operating temperature is about 25° C.

15. The computer-readable medium according to claim 14, wherein the predetermined threshold is 20 mV.

16. The computer-readable medium according to claim 14, wherein the predetermined threshold is 10 mV.

17. The computer-readable medium according to claim 12, further comprising subjecting the VCSEL to a burn-in period, wherein the burn-in period is a 4-hour time period prior to installation in which the VCSEL is subjected to a temperature of about 150° C.

18. The computer-readable medium according to claim 12, wherein the operating parameter that is adjusted comprises the operating temperature of the VCSEL.

19. The computer-readable medium according to claim 12, wherein the operating parameter that is adjusted comprises the operating current of the VCSEL.

20. The computer-readable medium according to claim 12, wherein the computer program instructions are further configured to generate an alarm condition in an instance in which failure of the VCSEL is determined.

* * * * *